(12) United States Patent
Reznicek et al.

(10) Patent No.: US 10,446,746 B1
(45) Date of Patent: Oct. 15, 2019

(54) RERAM STRUCTURE FORMED BY A SINGLE PROCESS

(71) Applicant: International Business Machines Corporation, Armonk, NY (US)

(72) Inventors: Alexander Reznicek, Troy, NY (US); Oscar van der Straten, Guilderland Center, NY (US); Adra Carr, Albany, NY (US); Praneet Adusumilli, Somerset, NJ (US)

(73) Assignee: International Business Machines Corporation, Armonk, NY (US)

( * ) Notice: Subject to any disclaimer, the term of this patent is extended or adjusted under 35 U.S.C. 154(b) by 16 days.

(21) Appl. No.: 15/968,213

(22) Filed: May 1, 2018

(51) Int. Cl.
*H01L 21/64* (2006.01)
*H01L 45/00* (2006.01)

(52) U.S. Cl.
CPC .......... *H01L 45/08* (2013.01); *H01L 45/1233* (2013.01); *H01L 45/1266* (2013.01); *H01L 45/1608* (2013.01)

(58) Field of Classification Search
CPC . H01L 45/08; H01L 45/1266; H01L 45/1233; H01L 45/1608
See application file for complete search history.

(56) References Cited

U.S. PATENT DOCUMENTS

| | | | |
|---|---|---|---|
| 8,735,211 B2 | 5/2014 | Greeley et al. | |
| 8,846,484 B2 | 9/2014 | Lee et al. | |
| 8,872,149 B1 | 10/2014 | Hsieh et al. | |
| 9,018,037 B1 | 4/2015 | Nardi et al. | |
| 9,184,378 B2 | 11/2015 | Choi et al. | |
| 9,331,275 B2 | 5/2016 | Sandhu | |
| 9,419,053 B2 | 8/2016 | Hsu | |
| 9,537,094 B2 | 1/2017 | Chang et al. | |
| 2008/0304312 A1* | 12/2008 | Ho | B82Y 10/00 365/148 |

FOREIGN PATENT DOCUMENTS

CN 105551579 * 5/2016 ............... H01B 5/14

OTHER PUBLICATIONS

K. Qian et al., "Direct observation of conducting filaments in tungsten oxide based transparent resistive switching memory," ACS Applied Materials & Interfaces, published Oct. 5, 2016, pp. 27885-27891, vol. 8, No. 41.

T. D. Dongale et al., "Bio-mimicking the synaptic weights, analog memory, and forgetting effect using spray deposited WO3 memristor device", Microelectronic Engineering, Oct. 7, 2017, 7 pages.

* cited by examiner

*Primary Examiner* — Cuong B Nguyen
*Assistant Examiner* — Samuel Park
(74) *Attorney, Agent, or Firm* — Scully, Scott, Murphy & Presser, P.C.; Daniel P. Morris, Esq.

(57) ABSTRACT

A method of forming a resistive random access memory device which contains uniform layer composition is provided. The method enables the in-situ deposition of a bottom electrode layer (i.e., a metal layer), a resistive switching element (i.e., at least one metal oxide layer), and a top electrode layer (i.e., a metal nitride layer and/or a metal layer) with compositional control. Resistive random access memory devices which contain uniform layer composition enabled by the in-situ deposition of the bottom electrode layer, the resistive switching element, and the top electrode layer provide significant benefits for advanced memory technologies.

10 Claims, 2 Drawing Sheets

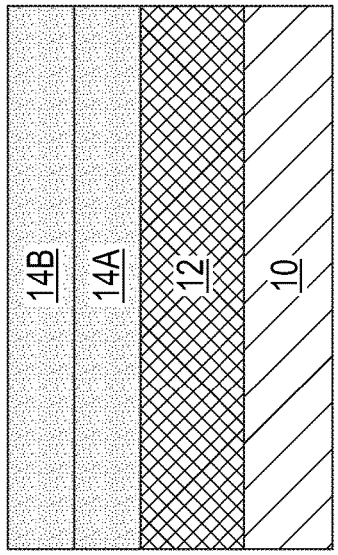
FIG. 5
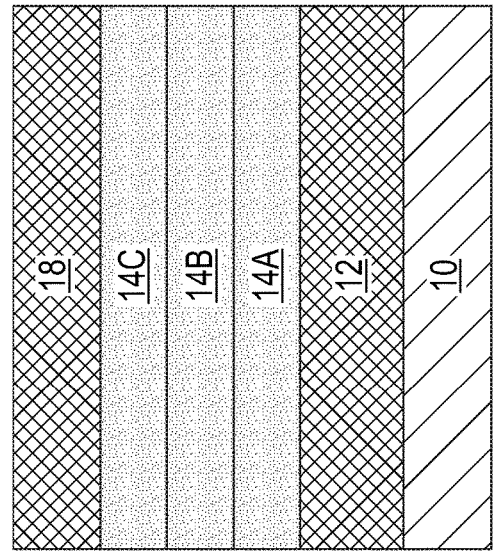
FIG. 6
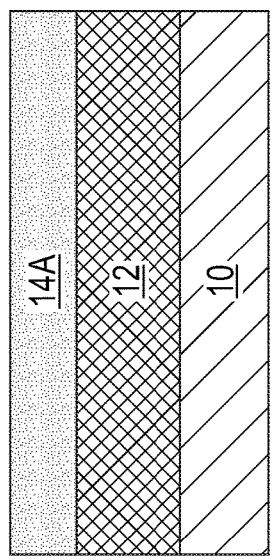
FIG. 7
FIG. 8

US 10,446,746 B1

RERAM STRUCTURE FORMED BY A SINGLE PROCESS

BACKGROUND

The present application relates to non-volatile memory, and more particularly to a resistive random access memory (ReRAM or RRAM) device made by a single process which enables the in-situ deposition of a bottom electrode layer (i.e., a metal layer), a resistive switching element (i.e., at least one metal oxide layer), and a top electrode layer (i.e., a metal nitride layer and/or a metal layer) with compositional control.

Many modern day electronic devices contain electronic memory. Electronic memory may be volatile memory or non-volatile memory. Non-volatile memory retains its stored data in the absence of power, whereas volatile memory loses its stored data when power is lost. Resistive random access memory (ReRAM or RRAM) is one promising candidate for the next generation of non-volatile memory due to its simple structure and its compatibility with complementary metal-oxide-semiconductor (CMOS) logic fabrication processes.

For metal/metal oxide ReRAMs, oxygen ion migration under an electric field leads to the formation/annihilation of a metal-rich conducting filament, providing resistive switching between a high-resistance state and a low resistance state. For example, W-rich conducting filaments can be formed in a $WO_3$-based ReRAM device.

ReRAM devices benefit greater from the presence of layers with uniform composition. In the case of a $WO_3$-based ReRAM device, poor composition can lead to mixed oxide phases which degrade device performance. However, a particular metal-oxide phase may enable the desired resistance characteristics from a given ReRAM device architecture. There is a need for cost reduction in ReRAM device fabrication by reducing both process complexity and the number of required processing steps.

SUMMARY

A method of forming a resistive random access memory device which contains uniform layer composition is provided. By "uniform composition" it is meant that a material layer has a single, well defined phase. The method enables the in-situ deposition of a bottom electrode layer (i.e., a metal layer), a resistive switching element (i.e., at least one metal oxide layer), and a top electrode layer (i.e., a metal nitride layer and/or a metal layer) with compositional control. Resistive random access memory devices which contain uniform layer composition enabled by the in-situ deposition of the bottom electrode layer, the resistive switching element, and the top electrode layer provide significant benefits for advanced memory technologies.

One aspect of the present application relates to a method of forming a resistive random access memory device. In one embodiment, the method may include forming, in a reactor chamber and under vacuum, a bottom electrode layer composed of a metal selected from tungsten (W) and molybdenum (Mo) on a surface of a substrate by sputtering the metal from a target in a first sputtering atmosphere composed of an inert gas. Next, a resistive switching element composed of an oxide of the metal is formed, without breaking the vacuum, on a surface of the bottom electrode layer by sputtering the metal from the target in a second sputtering atmosphere composed of the inert gas and oxygen. A first top electrode layer composed of a nitride of the metal is formed, without breaking the vacuum, on a surface of the resistive switching element by sputtering the metal from the target in a third sputtering atmosphere composed of the inert gas and nitrogen.

In another embodiment, the method may include forming, in a reactor chamber and under vacuum, a bottom electrode layer composed of a metal selected from tungsten (W) and molybdenum (Mo) on a surface of a substrate by sputtering the metal from a target in a first sputtering atmosphere composed of an inert gas. A resistive switching element comprising a plurality of regions (i.e., layers) composed of an oxide of the metal is formed, without breaking the vacuum, on a surface of the bottom electrode layer by sputtering the metal from the target in a second sputtering atmosphere composed of the inert gas and oxygen, wherein the oxygen present in the second sputtering atmosphere is increased in providing each region of the resistive switching element. Next, a top electrode layer composed of the metal is formed, without breaking the vacuum, on a surface of the resistive switching element by sputtering the metal from the target in the first sputtering atmosphere.

Another aspect of the present application relates to a resistive random access memory (ReRAM) device having uniform compositional layers. In one embodiment, the ReRAM device may include a bottom electrode layer composed of a metal selected from tungsten (W) and molybdenum (Mo) located on a surface of a substrate, a resistive switching element composed of an oxide of the metal located on a surface of the bottom electrode layer, and a top electrode layer composed of nitride of the metal or the metal located on a surface of resistive switching element, wherein an interface between the bottom electrode layer and the resistive switch element and an interface between the top electrode layer and the resistive switching element are sharp. The term "sharp" as used in conjunction with an interface denotes no intermixing of materials from either side of the interface.

BRIEF DESCRIPTION OF SEVERAL VIEWS OF THE DRAWINGS

FIG. 5 is a cross sectional view of the exemplary semiconductor structure of FIG. 1 after forming a first region of a resistive switching element on a surface of the bottom electrode layer.

FIG. 6 is a cross sectional view of the exemplary semiconductor structure of FIG. 5 after forming a second region of the resistive switching element on a surface of the first region.

FIG. 7 is a cross sectional view of the exemplary semiconductor structure of FIG. 6 after forming a third region of the resistive switching element on a surface of the second region.

FIG. 8 is a cross sectional view of the exemplary ReRAM device of FIG. 7 after forming a top electrode layer on a surface on the third region.

DETAILED DESCRIPTION

Figure 1:
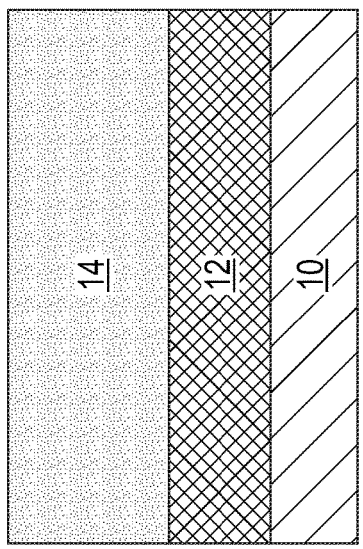
FIG. 1 is a cross sectional view of an exemplary resistive random access memory (ReRAM) device in accordance with the present application and during an early stage in fabrication which includes a bottom electrode layer located on a surface of a substrate.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

The present application provides a resistive random access memory (ReRAM or RRAM) device made by a single process which enables the in-situ deposition of a bottom electrode layer (i.e., a metal layer), a resistive switching element (i.e., at least one metal oxide layer), and a top electrode layer (i.e., a metal nitride layer and/or a metal layer) with compositional control. The single process includes in-situ deposition of the various layers of the ReRAM device without breaking vacuum between each deposition and by using a single target source during the deposition of each layer. In one embodiment of the present application, the bottom electrode layer is formed by sputtering in an inert gas only. After the sputtering of the bottom electrode layer, oxygen is added to the inert gas and an oxide of the metal is sputtered to form the resistive switching element. After sputtering the resistive switching element, and in one embodiment oxygen flow is eliminated and nitrogen is added, and the top electrode layer is then sputtered.

Referring now to FIG. 1, there is illustrated an exemplary resistive random access memory (ReRAM) device in accordance with the present application and during an early stage in fabrication. The exemplary ReRAM device at this point of the present application includes a bottom electrode layer 12 located on a surface of a substrate 10.

In some embodiments, substrate 10 may include a semiconductor substrate that contains at least one semiconductor material having semiconductor properties. Examples of semiconductor materials that can be employed include, for example, silicon (Si), germanium (Ge), a silicon germanium (SiGe) alloy, silicon carbide (SiC), silicon germanium carbide (SiGeC), a III-V compound semiconductor or a II-VI compound semiconductor. The semiconductor substrate may be a bulk semiconductor substrate or a semiconductor-on-insulator (SOI) substrate. A bulk semiconductor substrate is composed entirely of at least one semiconductor material, while an SOI substrate includes an insulator layer (such as, for example, silicon dioxide and/or boron nitride) located between a topmost semiconductor material and a handle substrate; the handle substrate is typically composed of a semiconductor material as well.

In other embodiments, substrate 10 may be composed of glass or a dielectric material. The thickness of the substrate 10 may vary and is inconsequential to the present application. It is noted that substrate 10 may unpatterned, as shown in FIG. 1, or it can be subjected to a patterning process such as, for example, lithography and etching, prior to the forming the bottom electrode layer 12 thereon.

The bottom electrode layer 12 is then formed on a surface of the substrate 10. In the present application, the bottom electrode layer 12 is formed by placing the substrate 10 in a reactor chamber of a deposition apparatus such as, for example, a reactor chamber of a physical vapor deposition (PVD) apparatus, applying a vacuum to the reactor chamber to remove air and/or contaminates from the reactor chamber, and thereafter the bottom electrode layer 12 is deposited onto the substrate 10 by sputtering a metal selected from tungsten (W) and molybdenum (Mo) from a target (containing the metal) in a first sputtering atmosphere composed of an inert gas. As used herein, "sputtering" denotes a method of depositing a film, in which a target of the desired material, i.e., source, is bombarded with particles, e.g., ions, which knock atoms from the target, and the dislodged target material deposits on the deposition surface. The sputtering of the bottom electrode layer 12 is typically performed at a temperature (i.e., wafer temperature) between nominal room temperature (i.e., 20° C.) and 375° C., and a process pressure between 2 mTorr and 60 mTorr.

As used herein, "an inert gas" is a gas such as, for example, helium, argon and/or neon, and/or xenon, and/or krypton, which does not react with the metal atoms that are knocked from the target and deposit on the surface of the substrate 10. In one embodiment, the inert gas that provides the first sputtering atmosphere is composed of argon. It is noted that the first sputtering atmosphere is composed entirely (i.e., 100 percent) of an inert gas (no other gases such as, for example, nitrogen or oxygen are present in the first sputtering atmosphere).

In one embodiment, the bottom electrode layer 12 and the target are composed of pure W metal (i.e., unalloyed W). In another embodiment, the bottom electrode layer 12 and the target are composed of pure Mo metal (i.e., unalloyed Mo). The bottom electrode layer 12 that is formed may have a thickness from 2 nm to 200 nm. Other thicknesses for the bottom electrode layer 12 are contemplated and thus can be employed in the present application.

Figure 2:
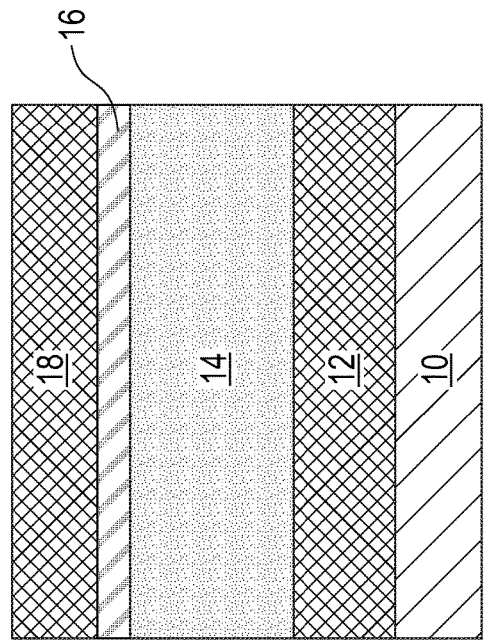
FIG. 2 is a cross sectional view of the exemplary ReRAM device of FIG. 1 after forming a resistive switching element on a surface of the bottom electrode layer.

Referring now to FIG. 2, there is illustrated the exemplary ReRAM device of FIG. 1 after in-situ formation of a resistive switching element 14 on a surface of the bottom electrode layer 12. The resistive switching element 14 is formed continuously and rapidly, without breaking the vacuum provided above, by sputtering the metal from the target in a second sputtering atmosphere of the inert gas and oxygen ($O_2$). In the present application, and after the bottom electrode layer 12 is sputtered, oxygen is added to the first sputtering atmosphere to provide the second sputtering atmosphere (i.e., an admixture of an inert gas and oxygen), and thereafter the resistive switching element 14 is sputtered in the presence of the inert gas/oxygen admixture. The sputtering temperature during the sputtering of the resistive switching element 14 is maintained to be between 100° C. and 300° C.

The inert gas that is used in the second sputtering atmosphere is the same as that used in the first sputtering atmosphere except that oxygen is added thereto. Thus, the sputtering of the resistive switching element 14 is performed by adding oxygen to the first sputtering atmosphere to provide the second sputtering atmosphere. The amount of oxygen that is present in the second sputtering atmosphere may be from 1 percent to 80 percent, with the remainder, up to 100 percent, being the inert gas. It is noted that the amount of oxygen that is present in the second sputtering atmosphere can be selected to provide a resistive switching element 14 having desired metal and oxygen contents.

In this embodiment, the resistive switch element 14 is a single layer which is composed of an oxide of the metal source used to sputter the bottom electrode layer 12. That is, and in one embodiment, the resistive switch element 14 is composed of an oxide of W such as, for example, $WO_2$, $W_2O_5$, or $WO_3$. In another embodiment, the resistive switch element 14 is composed of an oxide of Mo such as, for example $MoO_y$, wherein $2<y<3$.

The resistive switching element 14 that is formed may have a thickness from 1 nm to 100 nm. Other thicknesses for the resistive switching element 14 are contemplated and thus can be employed in the present application. In accordance with the present application, an interface is formed between the resistive switching element 14 and the bottom electrode layer 12 that is sharp.

Figure 3:
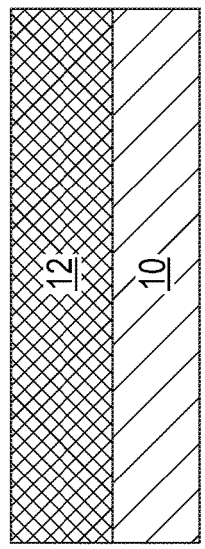
FIG. 3 is a cross sectional view of the exemplary ReRAM device of FIG. 2 after forming a first top electrode layer on a surface of the resistive switching element.

Referring now to FIG. 3, there is illustrated the exemplary ReRAM device of FIG. 2 after the in-situ formation of a first top electrode layer 16 on a surface of the resistive switching element 14. The first top electrode layer 16 is formed continuously and rapidly, without breaking the vacuum provided above, by sputtering the metal from the target in a third sputtering atmosphere of the inert gas and nitrogen ($N_2$). In the present application, and after sputtering the resistive switching element 14, oxygen is eliminated from the flow, and nitrogen is added to provide an admixture of the inert gas and nitrogen which is used in providing the first top electrode layer 16. The sputtering temperature during the formation of the first top electrode layer 16 is maintained to be between nominal room temperature and 375° C.

The inert gas that is used in the third sputtering atmosphere is the same as that used in the first sputtering atmosphere except that nitrogen is added thereto. In the present application, and after formation of the resistive switching element 14 oxygen is removed from the gas flow and replaced with nitrogen to provide the third sputtering atmosphere. The amount of nitrogen that is present in the third sputtering atmosphere may be from 1 percent to 70 percent, with the remainder, up to 100 percent, being the inert gas. It is noted that the amount of nitrogen that is present in the third sputtering atmosphere can be selected to provide a bottom electrode layer 16 having desired metal and nitrogen contents.

In this embodiment, the top electrode layer 16 is composed of a nitride of the metal used to sputter the bottom electrode layer 12. That is, and in one embodiment, the top electrode layer 16 is composed of a nitride of W such as, for example, $WN_x$, wherein $0.5<x<2$. In another embodiment, the top electrode layer 16 is composed of a nitride of Mo such as, for example $MoN_z$ wherein $0.5<z<3$.

The top electrode layer 16 that is formed may have a thickness from 2 nm to 200 nm. Other thicknesses for the top electrode layer 16 are contemplated and thus can be employed in the present application. In accordance with the present application, an interface is formed between the resistive switching element 14 and the top electrode layer 16 that is sharp.

Figure 4:
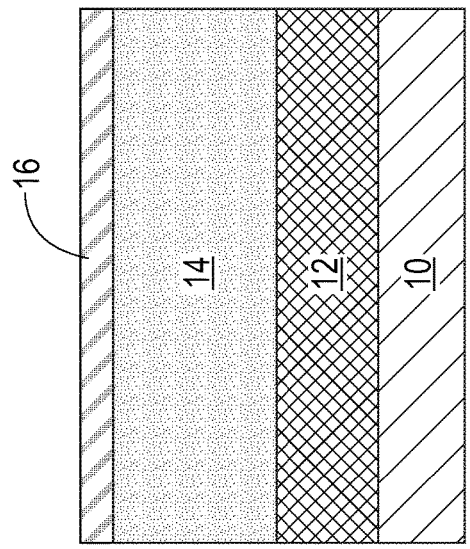
FIG. 4 is a cross sectional view of the exemplary ReRAM device of FIG. 3 after forming a second top electrode layer on a surface of the first top electrode layer.

Referring now to FIG. 4, there is illustrated the exemplary ReRAM device of FIG. 3 after the in-situ formation of a second top electrode layer 18 on a surface of the first top electrode layer 16. In some embodiments, this step is omitted. In other embodiments, the in-situ formation of first top electrode layer 16 is omitted. In such an embodiment, electrode layer 18 would form an interface with the restive switching element 14 that is sharp.

The second top electrode layer 18 is formed continuously and rapidly, without breaking the vacuum provided above, by sputtering the metal from the target in the first sputtering atmosphere of the inert gas. In the illustrated embodiment, and after formation of the first electrode layer 16, nitrogen is eliminated from the third sputtering atmosphere and the inert gas is present only during the sputtering of the second top electrode layer 18. The sputtering temperature during the formation of the second top electrode layer 18 is maintained to be between nominal room temperature and 375° C.

In one embodiment, the second top electrode layer 18 is composed of pure W metal (i.e., unalloyed W). In another embodiment, the second top electrode layer 18 is composed of pure Mo metal (i.e., unalloyed Mo). The second top electrode layer 18 that is formed may have a thickness from 2 nm to 200 nm. Other thicknesses for the second top electrode layer 18 are contemplated and thus can be employed in the present application. The second top electrode layer 18 forms an interface with either the first top electrode layer 16 or the resistive switching element 16 that is sharp.

Referring now to FIGS. 5-8, there is illustrated a method of the present application in which a resistive switching element (i.e., a graded restive switching element 14G) comprising a plurality of regions (e.g., 14A, 14B, 14C, etc.) composed of an oxide of the metal is formed in-situ on a surface of the bottom electrode layer 12 by sputtering the metal from the target in a second sputtering atmosphere of the inert gas and oxygen, wherein the oxygen present in the second sputtering atmosphere is increased in providing each region of the resistive switching element 14G such that the content of metal within each region decreases from bottom to top. In one embodiment, and for example, region 14A is composed of an oxide of a metal having a first metal content, second region 14B is composed of an oxide of a metal having a second metal content that is less than the first metal content, and third region 14C is composed of an oxide of a metal having a third metal content that is less than the second metal content.

Notably, FIG. 5 illustrates the exemplary semiconductor structure of FIG. 1 after forming a first region 14A of a resistive switching element 14G on a surface of the bottom electrode layer 12. The first region 14A of the resistive switching element 14G is formed continuously and rapidly, without breaking the vacuum provided above, by sputtering the metal from the target in a second sputtering atmosphere of the inert gas and a first content of oxygen ($O_2$), instead of the first sputtering atmosphere. In the present application, and after forming the bottom electrode layer 12, oxygen in a first amount is added to the first sputtering atmosphere and the admixture of the inert gas and oxygen is present during the sputtering of the first region 14A. The sputtering temperature is maintained to be between 100° C. and 300° C.

The inert gas that is used in the second sputtering atmosphere is the same as that used in the first sputtering atmosphere except that oxygen is added thereto. Thus, the sputtering of the first region 14A of the resistive switching element 14G is performed by adding oxygen to provide a first oxygen content to the first sputtering atmosphere to provide the second sputtering atmosphere. The first oxygen content that is present in the second sputtering atmosphere may be from 1 percent to 20 percent, with the remainder, up to 100 percent, being the inert gas.

In one embodiment, the first region 14A is composed of an oxide of tungsten. In one example, the first region 14A is composed of $WO_2$. In another embodiment, the first region 14A is composed of an oxide of molybdenum. In one example, the first region 14A is composed of $MoO_2$.

The first region 14A of resistive switching element 14G that is formed may have a thickness from 1 nm to 20 nm. Other thicknesses for first region 14A of the resistive switching element 14G are contemplated and thus can be employed in the present application. In accordance with the present application, an interface is formed between the first region 14A of resistive switching element 14G and the bottom electrode layer 12 that is sharp.

Referring now to FIG. 6, there is illustrated the exemplary semiconductor structure of FIG. 5 after forming a second region 14B of the resistive switching element 14G on a surface of the first region 14A. The second region 14B of the resistive switching element 14G is formed continuously and rapidly, without breaking the vacuum provided above, by sputtering the metal from the target in a first modified second sputtering atmosphere of the inert gas and a second content of oxygen ($O_2$), instead of the first content of oxygen. The sputtering temperature is maintained to be between 100° C. and 300° C.

The inert gas that is used in the first modified second sputtering atmosphere is the same as that used in the second sputtering atmosphere used in providing the first region 14A except that oxygen is added in an amount to provide a second oxygen content that is greater than the first oxygen content. The second oxygen content that is present in the first modified second sputtering atmosphere may be from 20 percent to 40 percent, with the remainder, up to 100 percent, being the inert gas.

In one embodiment, the second region 14B is composed of an oxide of tungsten. In one example, the second region 14B is composed of $W_2O_5$. In another embodiment, the second region 14B is composed of an oxide of molybdenum. In one example, the second region 14B is composed of $Mo_2O_5$.

The second region 14B of resistive switching element 14G that is formed may have a thickness from 1 nm to 20 nm. Other thicknesses for second region 14B of the resistive switching element 14G are contemplated and thus can be employed in the present application. In accordance with the present application, an interface is formed between the second region 14B and the first region 14A of resistive switching element 14G that is sharp.

Referring now FIG. 7, there is illustrated the exemplary semiconductor structure of FIG. 6 after forming a third region 14C of the resistive switching element 14G on a surface of the second region 14B. The third region 14C of the resistive switching element 14G is formed continuously and rapidly, without breaking the vacuum provided above, by sputtering the metal from the target in a second modified second sputtering atmosphere of the inert gas and a third content of oxygen ($O_2$), instead of the second content of oxygen. The sputtering temperature is maintained to be between 100° C. and 300° C.

The inert gas that is used in the second modified second sputtering atmosphere is the same as that used in the modified second sputtering atmosphere used in providing the second region 14B except that oxygen is added in an amount to provide a third oxygen content that is greater than the second oxygen content. The third oxygen content that is present in the second modified second sputtering atmosphere may be from 40 percent to 80 percent, with the remainder, up to 100 percent, being the inert gas.

In one embodiment, the third region 14C is composed of an oxide of tungsten. In one example, the third region 14C is composed of $WO_3$. In another embodiment, the third region 14C is composed of an oxide of molybdenum. In one example, the third region 14C is composed of $MoO_3$.

The third region 14C of resistive switching element 14G that is formed may have a thickness from 1 nm to 20 nm. Other thicknesses for third region 14C of the resistive switching element 14G are contemplated and thus can be employed in the present application. In accordance with the present application, an interface is formed between the third region 14C and the second region 14B of resistive switching element 14G that is sharp.

Additional regions of the resistive switching element 14G can be formed by sputtering the metal in the second sputtering atmosphere of an inert gas and increased content of oxygen. In accordance with the present application, the stack of regions has a metal content that decreases from bottom to top.

Referring now to FIG. 8, there is illustrated the exemplary ReRAM device of FIG. 7 after forming a top electrode layer 18 on a surface on the third region 14C. In the illustrated embodiment, the top electrode layer 18 is the same as that described above for providing top electrode layer 18 to the exemplary ReRAM device shown in FIG. 4 of the present application.

In some embodiments, first electrode layer 16 may be formed, as described above, prior to forming top electrode layer 18. The top electrode layer 18 is formed continuously and rapidly, without breaking the vacuum provided above, by sputtering the metal from the target in the first sputtering atmosphere of the inert gas. In the illustrated embodiment, oxygen is completely removed from the gas flow, and sputtering occurs only in the presence of the inert gas. The sputtering temperature is maintained to be between nominal room temperature and 375° C.

In one embodiment, the top electrode layer 18 is composed of pure W metal (i.e., unalloyed W). In another embodiment, the top electrode layer 18 is composed of pure Mo metal (i.e., unalloyed Mo). The electrode layer 18 that is formed may have a thickness from 2 nm to 200 nm. Other thicknesses for the electrode layer 18 are contemplated and thus can be employed in the present application. The top electrode layer 18 forms an interface with either the first top electrode layer 16 or the resistive switching element 16G that is sharp.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a resistive random access memory device, the method comprising:

forming, in a reactor chamber and under vacuum, a bottom electrode layer composed of a metal on a surface of a substrate by sputtering the metal from a target in a first sputtering atmosphere composed of an inert gas;

forming, without breaking the vacuum, a resistive switching element comprising a plurality of regions composed of an oxide of the metal on a surface of the bottom electrode layer by sputtering the metal from the target in a second sputtering atmosphere composed of the inert gas and oxygen, wherein the oxygen present in the second sputtering atmosphere is increased in providing each region of the resistive switching element; and forming, without breaking the vacuum, a top electrode layer composed of the metal on a surface of the resistive switching element by sputtering the metal from the target in the first sputtering atmosphere, wherein the metal that provides each of the bottom electrode layer, the resistive switching element, and the top electrode layer is tungsten (W), and the resistive switching element comprises, from bottom to top, a first region composed of $WO_2$, a second region composed of $W_2O_5$, and a third region composed of $WO_3$.

2. The method of claim 1, wherein the inert gas is argon.

3. The method of claim 1, wherein the sputtering of the metal that provides the bottom electrode layer is performed at a temperature from 20° C. to 375° C.

4. The method of claim 1, wherein the sputtering of the metal that provides the bottom electrode layer is performed at a process pressure between 2 mTorr and 60 mTorr.

5. The method of claim 1, wherein the sputtering that provides the resistive switching element is performed at a temperature between 100° C. and 300° C.

6. The method of claim 1, wherein the sputtering of the metal that provides the top electrode layer is performed at a temperature from 20° C. to 375° C.

7. The method of claim 1, wherein the sputtering of the resistive switching element comprises first sputtering using a first oxygen content from 1 percent to 20 percent, second sputtering using a second oxygen content from 20 percent to 40 percent, and third sputtering using a third oxygen content 40 percent to 80 percent.

8. The method of claim 1, wherein the first region has a thickness from 1 nm to 20 nm, the second region has a thickness from 1 nm to 20 nm, and the third region has a thickness from 1 nm to 20 nm.

9. The method of claim 1, wherein the sputtering of the metal that provides the bottom electrode layer and the sputtering of the metal that provides the top electrode is performed in the absence of oxygen.

10. The method of claim 1, wherein the bottom electrode is formed on a surface of a semiconductor substrate.

* * * * *